United States Patent
Totsuka

(10) Patent No.: US 11,276,530 B2
(45) Date of Patent: Mar. 15, 2022

(54) THIN-LAYER CAPACITOR AND METHOD OF FABRICATING THE SAME

(71) Applicant: Mitsubishi Electric Corporation, Tokyo (JP)

(72) Inventor: Masahiro Totsuka, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 142 days.

(21) Appl. No.: 16/756,299

(22) PCT Filed: Jan. 19, 2018

(86) PCT No.: PCT/JP2018/001583
§ 371 (c)(1),
(2) Date: Apr. 15, 2020

(87) PCT Pub. No.: WO2019/142317
PCT Pub. Date: Jul. 25, 2019

(65) Prior Publication Data
US 2020/0243266 A1    Jul. 30, 2020

(51) Int. Cl.
*H01G 4/12* (2006.01)
*H01G 4/30* (2006.01)
(Continued)

(52) U.S. Cl.
CPC ............... *H01G 4/306* (2013.01); *H01G 4/10* (2013.01); *H01G 4/1272* (2013.01); *H01L 28/40* (2013.01); *H01L 29/76* (2013.01); *H01L 29/94* (2013.01)

(58) Field of Classification Search
None
See application file for complete search history.

(56) References Cited

U.S. PATENT DOCUMENTS 5,688,724 A    11/1997  Yoon et al.
7,956,406 B2 *  6/2011  Yasuda ............ H01L 29/40117
                                                         257/324
(Continued)

FOREIGN PATENT DOCUMENTS

CN    1779980 A     5/2006
CN  101015052 A     8/2007
(Continued)

OTHER PUBLICATIONS

International Search Report issued in PCT/JP2018/001583; dated Apr. 17, 2018.
(Continued)

*Primary Examiner* — Dion R. Ferguson
(74) *Attorney, Agent, or Firm* — Studebaker & Brackett PC

(57) ABSTRACT

An MIM capacitor or an MIS capacitor in semiconductor devices is formed of a thin dielectric layer having a total film thickness less than 100-nm and including a high-dielectric-constant amorphous insulating film, high-breakdown-voltage amorphous films such as of $SiO_2$, and high-dielectric-constant amorphous buffer films between an upper electrode and a lower electrode. The thin high-dielectric-constant amorphous insulation film is formed of a material having a property resistant to fracture although having properties of a large leakage current and a low breakdown voltage, to enhance reliability of the thin dielectric layer and to reduce the footprint thereof in the semiconductor device.

7 Claims, 10 Drawing Sheets

(51) Int. Cl.
    *H01G 4/10*    (2006.01)
    *H01L 29/76*   (2006.01)
    *H01L 49/02*   (2006.01)
    *H01L 29/94*   (2006.01)

(56) References Cited

U.S. PATENT DOCUMENTS

| | | | |
|---|---|---|---|
| 8,368,175 B2* | 2/2013 | Nakagawa | H01L 21/02194 257/532 |
| 9,691,973 B2* | 6/2017 | Ino | H01L 45/1233 |
| 10,680,071 B2* | 6/2020 | Yamaguchi | H01L 21/02197 |
| 2004/0195653 A1* | 10/2004 | Morozumi | H01L 28/40 257/532 |
| 2006/0081905 A1 | 4/2006 | Won et al. | |
| 2007/0228442 A1* | 10/2007 | Kakimoto | H01L 28/40 257/310 |
| 2008/0017954 A1* | 1/2008 | Suzuki | H01L 21/022 257/637 |
| 2008/0090375 A1* | 4/2008 | Kitamura | H01L 28/40 438/396 |
| 2009/0078990 A1* | 3/2009 | Yasuda | H01L 29/4234 257/326 |
| 2010/0006976 A1* | 1/2010 | Kume | H01L 28/40 257/516 |
| 2010/0136780 A1 | 6/2010 | Natori et al. | |
| 2011/0018100 A1* | 1/2011 | Nakagawa | H01L 21/02271 257/532 |
| 2011/0227193 A1 | 9/2011 | Makiyama | |
| 2015/0380641 A1* | 12/2015 | Ino | C01G 27/00 257/4 |
| 2016/0087028 A1* | 3/2016 | Hirota | C23C 16/45525 257/532 |
| 2016/0105174 A1* | 4/2016 | Uesugi | H01L 27/1225 326/102 |
| 2018/0337055 A1* | 11/2018 | Yamaguchi | H01L 21/02197 |
| 2019/0081130 A1* | 3/2019 | Koyanagi | H01L 21/31155 |
| 2020/0243266 A1* | 7/2020 | Totsuka | H01L 28/40 |

FOREIGN PATENT DOCUMENTS

| | | |
|---|---|---|
| JP | H05110009 A | 4/1993 |
| JP | H06077402 A | 3/1994 |
| JP | H11150246 A | 6/1999 |
| JP | 2007287856 A | 11/2007 |
| JP | 2011199062 A | 10/2011 |
| WO | 2006/028215 A1 | 3/2006 |

OTHER PUBLICATIONS

An Office Action mailed by China National Intellectual Property Administration dated May 27, 2021, which corresponds to Chinese Patent Application No. 201880086459.4 and is related to U.S. Appl. No. 16/756,299; with English language translation.

An Office Action mailed by the Korean Intellectual Property Office dated Dec. 20, 2021, which corresponds to Korean Patent Application No. 10-2020-7019456 and is related to U.S. Appl. No. 16/756,299 with English language translation.

\* cited by examiner

| configuration of dielectric layer | forming method | total film thickness $L_t$ (nm) | MTTF (hr) @ 1 MV/cm |
|---|---|---|---|
| SiN single layer | plasma CVD | 50 | 2E+02 |
| $Ta_2O_5/SiO_2$ stacked films (S=9 nm, $T_2$=9 nm, n=1) | ALD | | 5E+11 |
| $Ta_2O_5/SiO_2$ stacked films (S=9 nm, $T_2$=4.5 nm, n=2) | | | 3E+06 |

FIG. 9

THIN-LAYER CAPACITOR AND METHOD OF FABRICATING THE SAME

TECHNICAL FIELD

The present application relates to a thin layer capacitor that enables an MIM capacitor or an MIS capacitor, which is a constituent element of a semiconductor device, to have a high reliability and to reduce its footprint in the semiconductor device and relates to a method of fabricating the thin layer capacitor.

BACKGROUND ARTS

An example of a cross sectional view of a conventional structure of a metal-insulator-metal (MIM) capacitor, which is a semiconductor device or its constituent element, is shown in FIG. 10 (see, for example, Patent Document 1). An MIM capacitor is a constituent element of a semiconductor device such as, for example a microwave monolithic IC (MMIC) and ordinarily has such a large footprint (the area of the plane opposite to the semiconductor substrate) as to occupy 20% to 30% of the whole area of the semiconductor device. The large footprint of the MIM capacitor accordingly leads to an impediment to reduction of the whole area of the semiconductor device. In other words, since reduction of the footprint of the MIM capacitor significantly contributes to reduction of manufacturing costs, effective use of the area occupied by the MIM capacitor in the semiconductor device is a major challenge.

PRIOR ART DOCUMENTS

Patent Documents

Patent Document 1: JP H11-150246 A
Patent Document 2: JP 2007-287856 A
Patent Document 3: JP 2011-199062 A
Patent Document 4: JP H06-077402 A

SUMMARY OF THE INVENTION

Problem that the Invention is to Solve

In order to reduce the area of an MIM capacitor, it is effective to form thinner the dielectric layer to increase electrostatic capacitance per unit area. For example, reducing the thickness of the dielectric layer to ½ enables the area of the MIM capacitor to be reduced to ½ because the electrostatic capacitance becomes two hold.

Silicon nitride or silicon oxide, which is easy to be formed into a capacitor having a high breakdown voltage and a necessary reliability, is generally used for a dielectric material. If a silicon nitride or a silicon oxide layer is reduced to less than 100 nm thickness, however, an MIM capacitor formed thereof rapidly deteriorates in reliability (mean time to failure (MTTF)), thus posing a problem that such a thin layer is not applicable to the thin layer capacitor.

In a conventional thin layer capacitor, a defect occurred in either electrode interface due to long time application of a voltage in a time dependent dielectric breakdown (TDDB) test for determining its MTTF is likely to penetrate the dielectric layer 30 from either side of the upper electrode and the lower electrode, as indicated by the arrows shown in FIG. 10 (the length of each arrow indicates extension of the defect), and this will lead the thin layer capacitor to fracture and failure in a short time.

The present application aims to provide a thin layer capacitor that eliminates these problems and a method of fabricating the thin layer capacitor.

Means for Solving the Problem

A thin layer capacitor in a semiconductor device, comprising:
a dielectric layer of less than 100-nm thickness formed of a plurality of stacked dielectric films having different electric properties and breakdown voltage less than 3 MV/cm and arranged between an upper electrode and a lower electrode, the dielectric layer having:
high-dielectric-constant amorphous buffer films formed of a dielectric material having a dielectric constant higher than the dielectric constant of silicon nitride and arranged in outermost parts of the dielectric layer and in contact with the upper electrode and the lower electrode, respectively; and
an intermediate dielectric layer arranged in an intermediate part between the high-dielectric-constant amorphous buffer films, the intermediate dielectric layer including:
high-breakdown-voltage amorphous films formed of a dielectric material selected among silicon nitride ($Si_xN_y$), silicon oxide ($Si_xO_y$), and silicon oxynitride ($Si_xO_yN_z$) having a breakdown voltage of 8 MV/cm or higher and arranged between and in contact with the high-dielectric-constant amorphous buffer films; and
a high-dielectric-constant amorphous insulating film formed of a dielectric material having a dielectric constant higher than a dielectric constant of silicon nitride and breakdown voltage less than 3 MV/cm and arranged between and in contact with the high-breakdown-voltage amorphous films.

Advantage Effect of the Invention

Forming a high-dielectric-constant amorphous insulating film between high breakdown voltage films such as of $SiO_2$ prevents penetration of a defect, thus being able to achieve an MTTF of practical level (longer than 1E+06 hrs, i.e., one million hrs).

BRIEF DESCRIPTION OF THE DRAWINGS

FIG. 9 is a table listing measured MTTF values of the thin layer capacitors according to Embodiments 1, and 4 to 7 of the present application.

EMBODIMENTS FOR CARRYING OUT THE INVENTION

Embodiment 1

Figure 1:
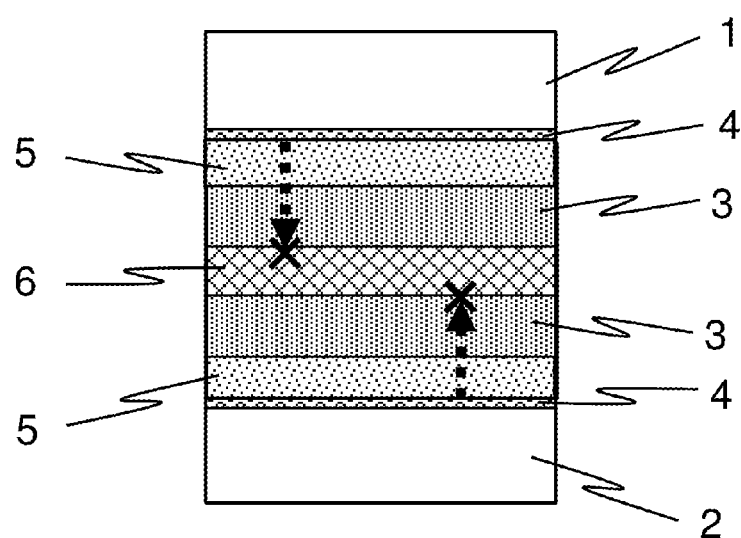
FIG. 1 is a cross-sectional view of a thin layer capacitor according to Embodiment 1 of the present application.

A cross-sectional view of a thin layer capacitor according to Embodiment 1 of the present application is shown in FIG. 1. The thin layer capacitor is an example of an MIM capacitor formed of a dielectric layer between an upper electrode 1 and a lower electrode 2. To be more specific, the thin layer capacitor is formed such that high-dielectric-constant amorphous insulating films are in contact with the upper electrode 1 and the lower electrode 2, respectively. This is due to the fact that if a high-breakdown-voltage amorphous film 3 is in direct contact with the upper electrode 1 or the lower electrode 2, a defect occurs due to an electric field concentration at the interface 4 between the dielectric layer and the electrode surface having microscopic asperities (referred to also as surface roughness) and a fracture is thereby likely to extend into the high-breakdown-voltage amorphous film 3. Hence, a fracture is prevented by forming the high-dielectric-constant amorphous insulating films, which are resistant to fracture, in contact with the upper electrode 1 and the lower electrode 2 without forming the high-breakdown-voltage amorphous film 3 in direct contact with the upper electrode 1 or the lower electrode 2. Note that in the above, the term "high dielectric constant" in the high-dielectric-constant amorphous insulating films denotes a dielectric constant higher than that of silicon nitride (ordinarily, about 7).

Furthermore, a high-dielectric-constant amorphous insulating film 6 that is resistant to fracture is formed between the high-breakdown-voltage amorphous films 3 so that when a fracture extends into either the high-breakdown-voltage amorphous films 3, the defect does not penetrate across the upper electrode 1 and lower electrode 2. By forming such a layer configuration, a fracture due to a defect stops extending at a point indicated by the symbol "×" shown in FIG. 1 and does not extend any further even though extends in the direction indicated by the arrow shown in the figure. That is, even though the high-dielectric-constant amorphous insulating film 6 is a low breakdown-voltage film, the fracture due to the defect does not extend into the high-dielectric-constant amorphous insulating film 6. Note that the high-dielectric-constant amorphous insulating films formed in contact with the upper electrode 1 and the lower electrode 2, respectively, are hereinafter referred to as "high-dielectric-constant amorphous buffer films 5". And, in the above-mentioned dielectric layer, a part except for the high-dielectric-constant amorphous buffer films is referred to as "intermediate part", and the films formed in the intermediate part are collectively referred to as "intermediate dielectric layer".

As described above, even though a defect occurs at the interface, a fracture due to the defect does not penetrate the dielectric layer, thus achieving improvement of reliability of the thin layer capacitor while maintaining a good breakdown voltage of and a low leakage current in the high-breakdown-voltage amorphous film 3.

This is due to the fact that although a high-dielectric-constant amorphous insulating film such as of $Ta_2O_5$ (the term "high dielectric constant" here denotes a dielectric constant higher with respect to that of silicon nitride, i.e., a value of 7 or higher as a guideline, preferably of 10 or higher) causes a large leakage current and its breakdown voltage is estimated to be low (lower than 3 MV/cm) for this reason, the insulating film has a property that fracture is less likely to occur and penetration of a defect is prevented by forming the high-dielectric-constant amorphous insulating film between high-breakdown-voltage films such as of $SiO_2$ (the term "high breakdown voltage" here ordinarily refers to as 8 MV/cm or high). The breakdown voltage here is defined as an applied voltage with a leakage current of 0.1 A/cm². Note that the dielectric material needs to be amorphous because a poly-crystal material is likely to cause a fracture at grain boundaries. In addition, the lower electrode 2 does not need to have a planar surface as shown in FIG. 1 and may have an uneven surface like a trench structure (not shown).

Figure 2:
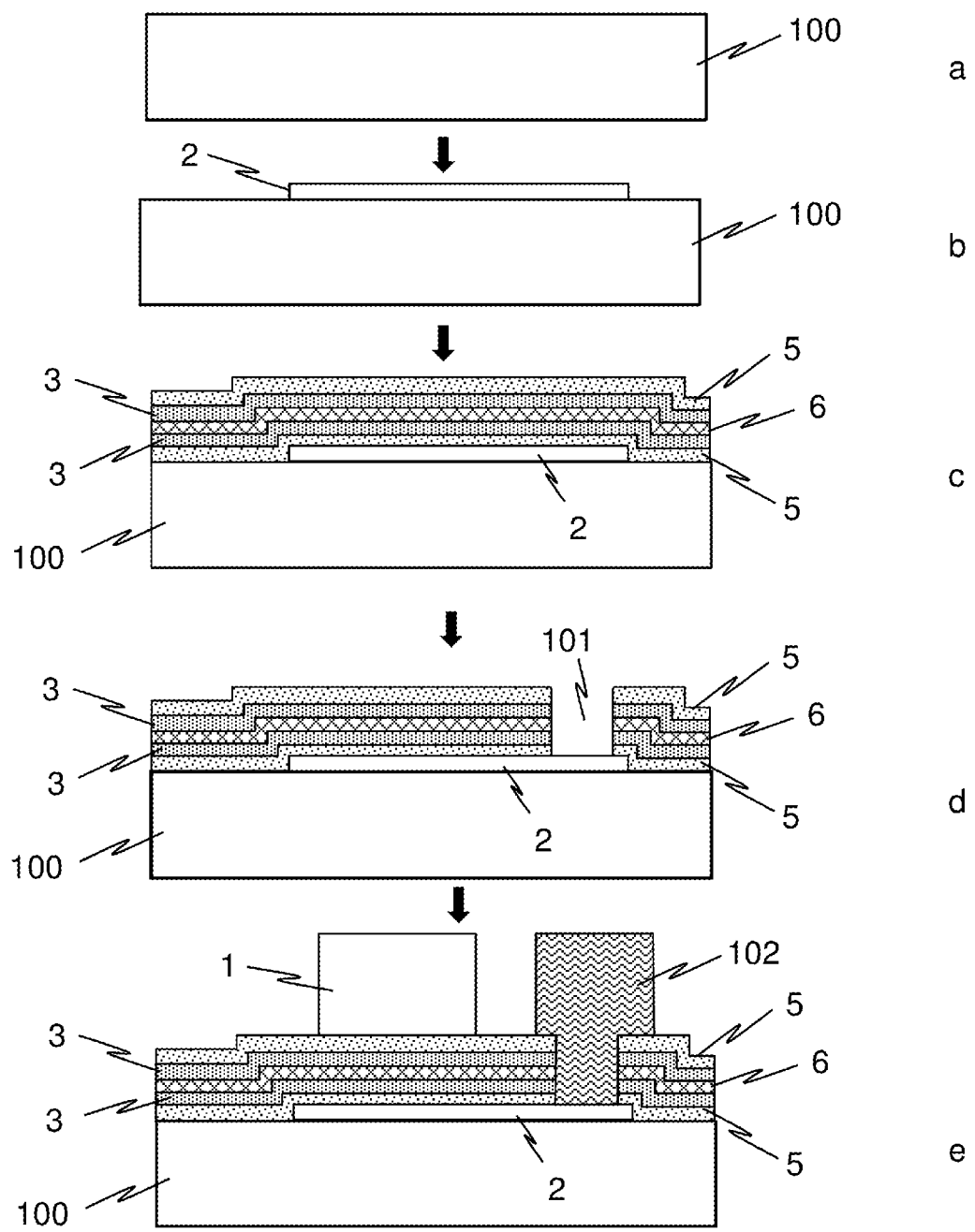
FIG. 2 is a process flow for explaining a method of fabricating the thin layer capacitor according to Embodiment 1 of the present application.

The thin layer capacitor according to Embodiment 1 is desirably fabricated using a method in accordance with the process flow shown in FIG. 2. The fabricating process is described below with reference to the figure.

(1) First, a semi-insulating semiconductor substrate 100 such as of gallium arsenide (GaAs) is prepared (the process a in FIG. 2).

(2) Next, the lower electrode 2 is formed on the semi-insulating semiconductor substrate using a liftoff technique by patterning a metal such as titan (Ti), gold (Au), or platinum (Pt) deposited by a vapor deposition or a sputtering (the process b in FIG. 2).

(3) Next, the high-dielectric-constant amorphous insulating film 6, the high-dielectric-constant amorphous buffer film 5, and the high-breakdown-voltage amorphous film 3 are deposited using an atomic layer deposition (ALD). The deposition on the lower electrode 2 is performed continuously in the same deposition chamber without exposure to the atmosphere in order of the high-dielectric-constant amorphous buffer film 5, the high-breakdown-voltage amorphous film 3, the high-dielectric-constant amorphous insulating film 6, the high-breakdown-voltage amorphous film 3, and high-dielectric-constant amorphous buffer film 5 (the process c in FIG. 2). Employing the ALD technique improves reliability of the thin layer capacitor because a defect and ingress of impurities are less likely to occur at the interfaces between the high-dielectric-constant amorphous insulating film 6 and the high-dielectric-constant amorphous buffer film 3 and between the high-dielectric-constant amorphous buffer film 5 and the high-breakdown-voltage amorphous film 3.

(4) Next, a contact hole 101 is formed such as by dry etching the dielectric layer formed in the process (3), in order of the high-dielectric-constant amorphous buffer film 5, the high-breakdown-voltage amorphous film 3, the high-dielectric-constant amorphous insulating film 6, the high-breakdown-voltage amorphous film 3, and the high-dielectric-constant amorphous buffer film 5 (the process d in FIG. 2).

(5) The upper electrode 1 and an interconnection 102 are formed using a liftoff technique by patterning a metal such as titan (Ti), gold (Au), or platinum (Pt) deposited by a vapor deposition or a sputtering (the process e in FIG. 2).

Embodiment 2

Figure 3:
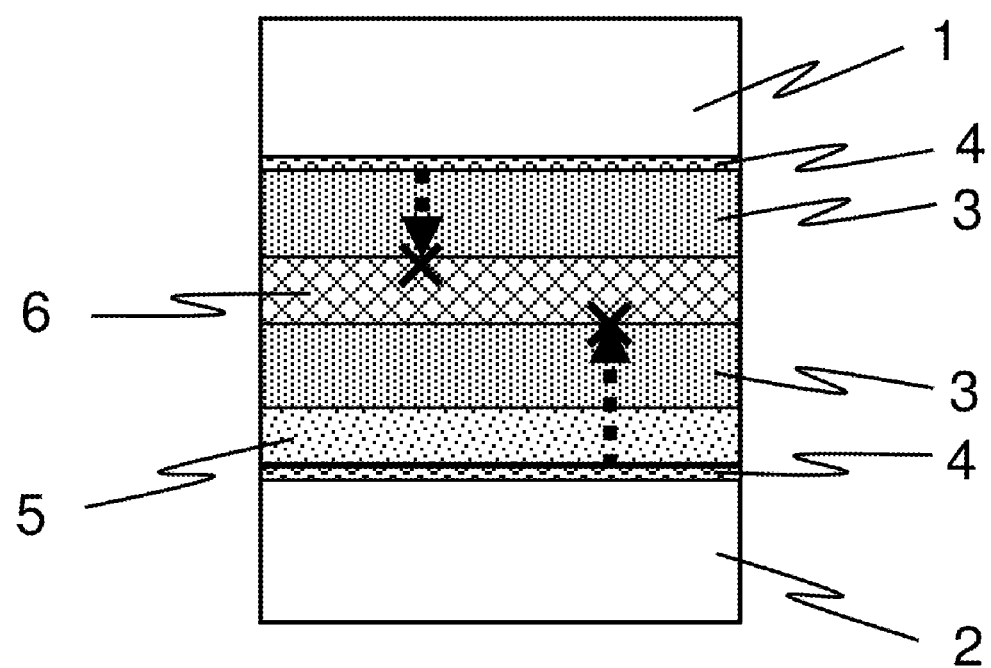
FIG. 3 is a cross-sectional view of a thin layer capacitor according to Embodiment 2 of the present application.

A cross-sectional view of a thin layer capacitor according to Embodiment 2 of the present application is shown in FIG. 3. The thin layer capacitor of Embodiment 2 is an MIM capacitor that has a configuration such that the high-dielectric-constant amorphous buffer film 5 is in contact only with the lower electrode 2 at the interface 4, i.e., the boundary between the surface of the electrode and the dielectric layer. The configuration other than that is the same as that described in Embodiment 1.

The thin layer capacitor according to Embodiment 2, although cannot prevent a defect from occurring at the interface between the upper electrode 1 and the high-breakdown-voltage amorphous film 3, has a merit of reducing the number of dielectric films. Note that while the above describes that the configuration of the thin layer capacitor is such that the high-dielectric-constant amorphous buffer film 5 is in contact with only the lower electrode 2, the configuration is not limited to this but may be such that the high-dielectric-constant amorphous buffer film 5 is in contact with only the upper electrode 1.

Embodiment 3

Figure 4:
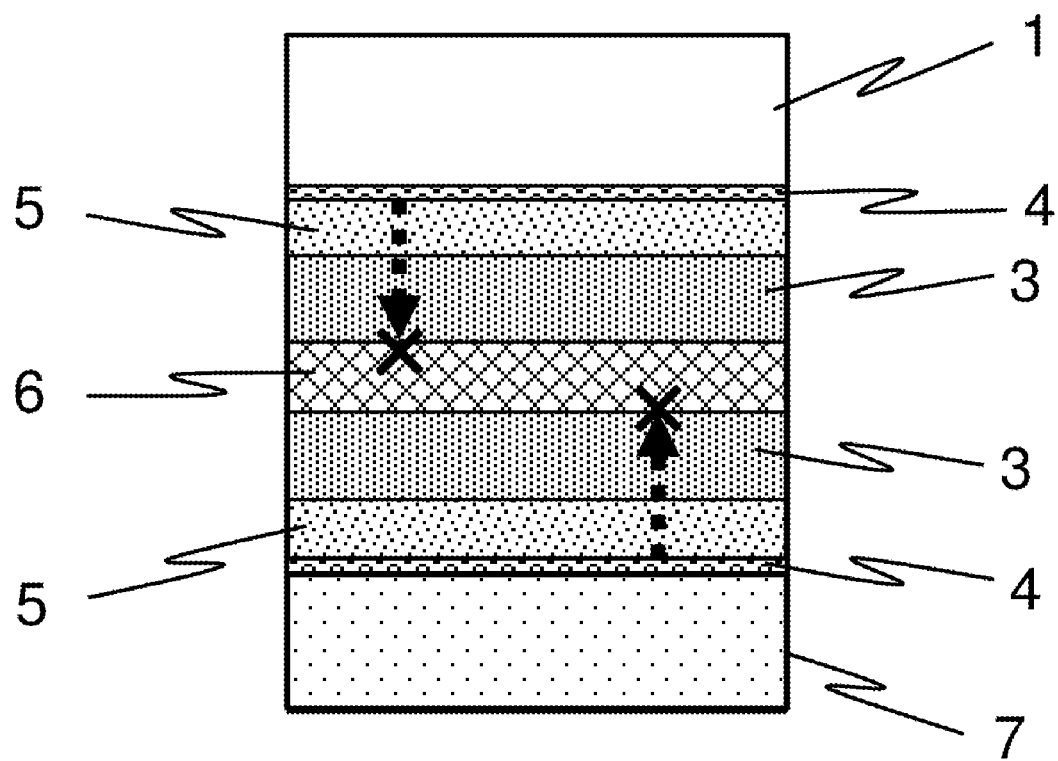
FIG. 4 is a cross-sectional view of a thin layer capacitor according to Embodiment 3 of the present application.

A cross-sectional view of a thin layer capacitor according to Embodiment 3 of the present application is shown in FIG. 4. In Embodiment 3, a semiconductor 7 is formed instead of the lower electrode 2 of Embodiment 1. In other words, the thin layer capacitor of the present embodiment has a configuration of a metal insulator semiconductor (MIS) capacitor. The configuration other than this is the same as that of the thin layer capacitor of Embodiment 1. Employing this configuration also allows for obtaining the same fracture preventing effect as that of Embodiment 1. Moreover, employing the configuration brings a new effect of being able to apply also to a gate structure of an MIS transistor; hence, an MIC transistor of high reliability can be fabricated.

Embodiment 4

Figure 5:
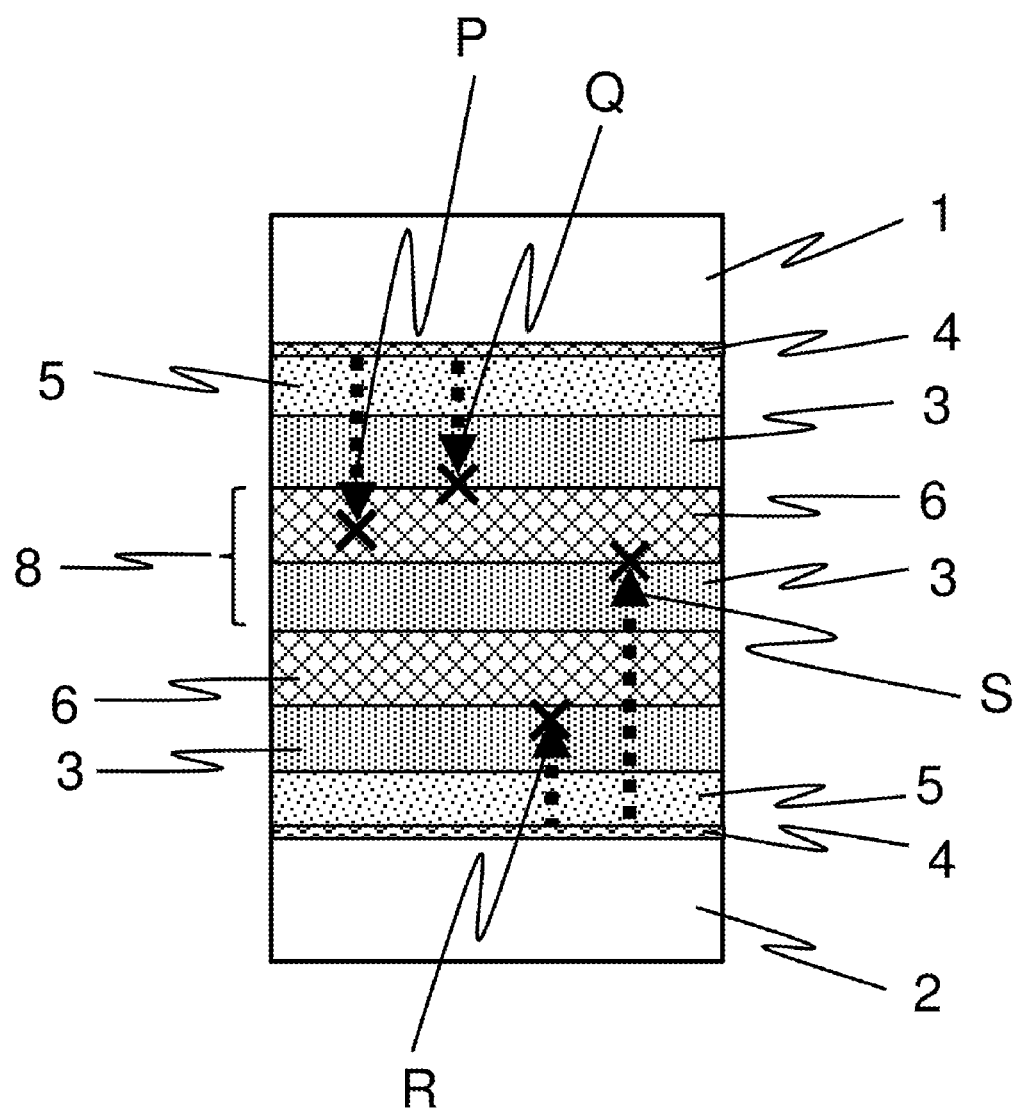
FIG. 5 is a cross-sectional view of a thin layer capacitor according to Embodiment 4 of the present application.

A cross-sectional view of an example of a thin layer capacitor according to Embodiment 4 of the present application is shown in FIG. 5. In order to further ensure prevention of defect growth from either interface of the upper and the lower electrodes, the thin layer capacitor of the present embodiment has a feature in that it is formed including a combined dielectric layer 8 constituted with another high-dielectric-constant amorphous insulating film 6 and a high-breakdown-voltage amorphous film 3 that is a dielectric film having a breakdown voltage of 8 MV/cm or high, in addition to the high-dielectric-constant amorphous insulating film 6 formed between the two upper and lower high-breakdown-voltage amorphous films 3 in the thin layer capacitor already described in Embodiment 1. While FIG. 5 shows the thin layer capacitor formed by adding only one combined dielectric layer 8 to that of Embodiment 1, the configuration of a thin film capacitor is not limited to this. A thin film capacitor may be formed including two or more combined dielectric layers 8. The effect of preventing defect growth increases with increasing number of added films.

Most defects occurred in the thin layer capacitor thus formed according to Embodiment 4 stop extending at a point, indicated by, for example, the symbol "×" at tip of the dotted arrow Q or R shown in the figure, on the interface between the uppermost high-breakdown-voltage amorphous film 3 and its neighboring high-dielectric-constant amorphous insulating film 6 or between the lowermost high-breakdown-voltage amorphous film 3 and its neighboring high-dielectric-constant amorphous insulating film 6.

Even though a defect, in some rare cases, extends further without stopping at the interface between the uppermost or the lowermost high-breakdown-voltage amorphous film 3 and its neighboring high-dielectric-constant amorphous insulating film 6, the defect stops extending at a point, indicated by the symbol "×" at tip of the dotted arrow P or S shown in the figure, on the next interface between the middle positioned high-breakdown-voltage amorphous film 3 and its lower or upper neighboring high-dielectric-constant amorphous insulating film 6.

As described above, the more the number of high-dielectric-constant amorphous insulating film 6, the more difficult a defect penetrates across the upper electrode and the lower electrode (both cases of extending a defect from the upper electrode toward the lower electrode and from the lower electrode toward the upper electrode). Accordingly, the reliability can be more enhanced. Furthermore, forming the high-breakdown-voltage amorphous film 3 in the middle position between the two high-dielectric constant amorphous insulating films 6 adds an effect of increasing breakdown resistance of the dielectric layer as a whole.

Embodiment 5

Figure 6:
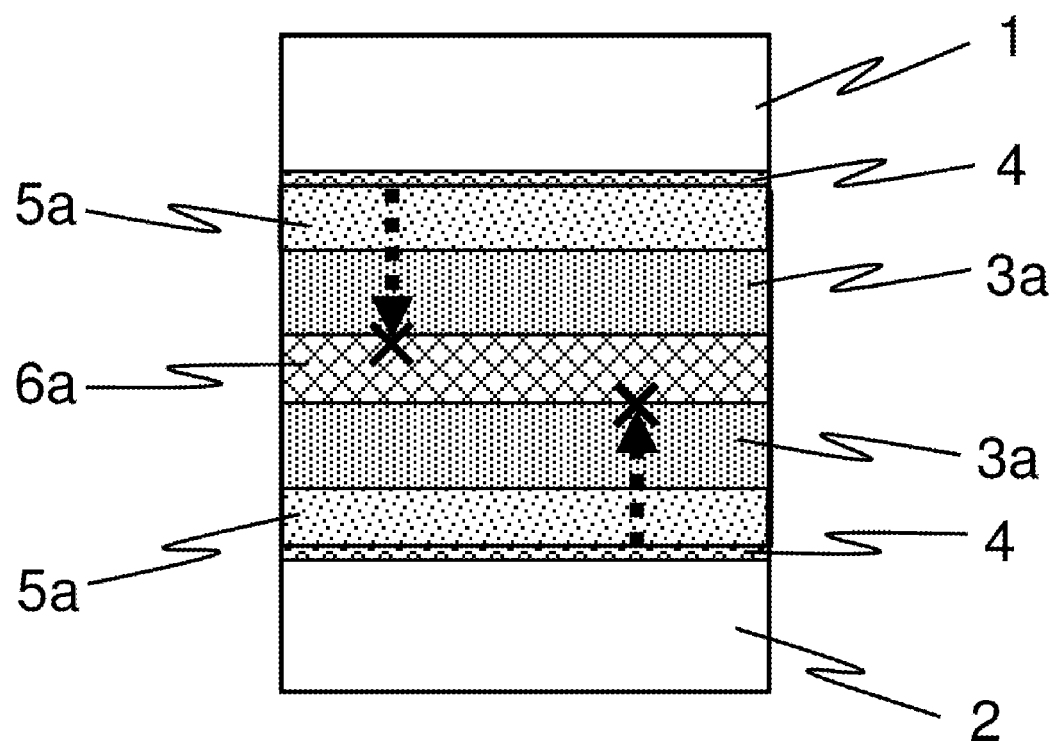
FIG. 6 is a cross-sectional view of a thin layer capacitor according to Embodiment 5 of the present application.

A cross-sectional view of a thin layer capacitor according to Embodiment 5 of the present application is shown in FIG. 6. The thin layer capacitor of the present embodiment is different from that of Embodiment 1 in that high-dielectric-constant amorphous buffer films 5a and a high-dielectric-constant amorphous insulating film 6a both having a breakdown voltage less than 3 MV/cm are employed as the high-dielectric-constant amorphous buffer films 5 and the high-dielectric-constant amorphous insulating film 6, and in that high-breakdown-voltage amorphous films 3a having a breakdown voltage of 8 MV/cm or higher are employed as the high-breakdown-voltage amorphous films 3.

Since the thin layer capacitor of the present embodiment formed including the high-dielectric-constant amorphous buffer films 5a and the high-dielectric-constant amorphous insulating film 6a both having a breakdown voltage lower than 3 MV/cm is high resistant to fracture, the thin layer capacitor formed including the high-breakdown-voltage amorphous films having a breakdown voltage of 8 MV/cm or higher has a structure further advantageous to a high reliability.

Embodiment 6

Figure 7:
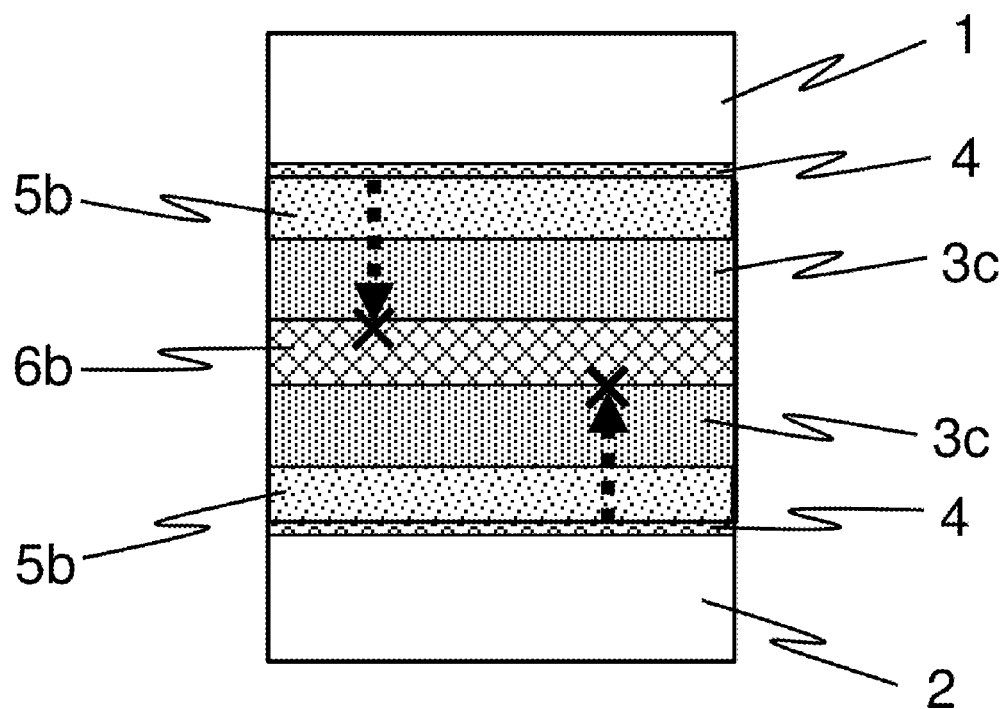
FIG. 7 is a cross-sectional view of a thin layer capacitor according to Embodiment 6 of the present application.

A cross-sectional view of a thin layer capacitor according to Embodiment 6 of the present application is shown in FIG. 7. The thin layer capacitor of the present embodiment has a feature in that high-dielectric-constant amorphous buffer films 5b and a high-dielectric-constant amorphous insulating film 6b, which correspond to the high-dielectric-constant amorphous insulating films in Embodiment 1, are formed of a material selected among those limited to tantalum oxide ($Ta_xO_y$), hafnium oxide ($Hf_xO_y$), zirconium oxide ($Zr_xO_y$), titanium oxide ($Ti_xO_y$), lanthanum oxide ($La_xO_y$), niobium oxide ($Nb_xO_y$), aluminum oxide ($Al_xO_y$), yttrium oxide ($Y_xO_y$), strontium titanate ($Sr_xTi_yO_z$), and barium strontium titanate ($Ba_wSr_xTi_yO_z$), and high-breakdown-voltage amorphous films 3c, which are the high-breakdown-voltage amorphous films in Embodiment 1, are formed of a material selected among those limited to silicon nitride ($Si_xN_y$), silicon oxide ($Si_xO_y$), and silicon oxynitride ($Si_xO_yN_z$). Here, w, x, y, z denote composition ratios, which are determined from the ratios of composition when forming the amorphous film, and take arbitrary values.

The above-listed materials for the high-dielectric-constant amorphous insulating films have a high resistance to fracture; hence, forming the combined dielectric layer of a combination of any of these materials and any of the above-listed materials for the high-breakdown-voltage amorphous film particularly enhances the reliability of the thin layer capacitor. Note that in a case of forming the thin layer capacitor of multiples of high-dielectric-constant amorphous buffer films 5, high-dielectric-constant amorphous insulating films 6, and high-breakdown-voltage amorphous films 3 as described in Embodiment 4, materials of the same compositions with the same composition ratios may be selected for these kinds of films or a part of them, respectively, or materials of different compositions with different composition ratios may be selected for the films, respectively.

Embodiment 7

Figure 8:
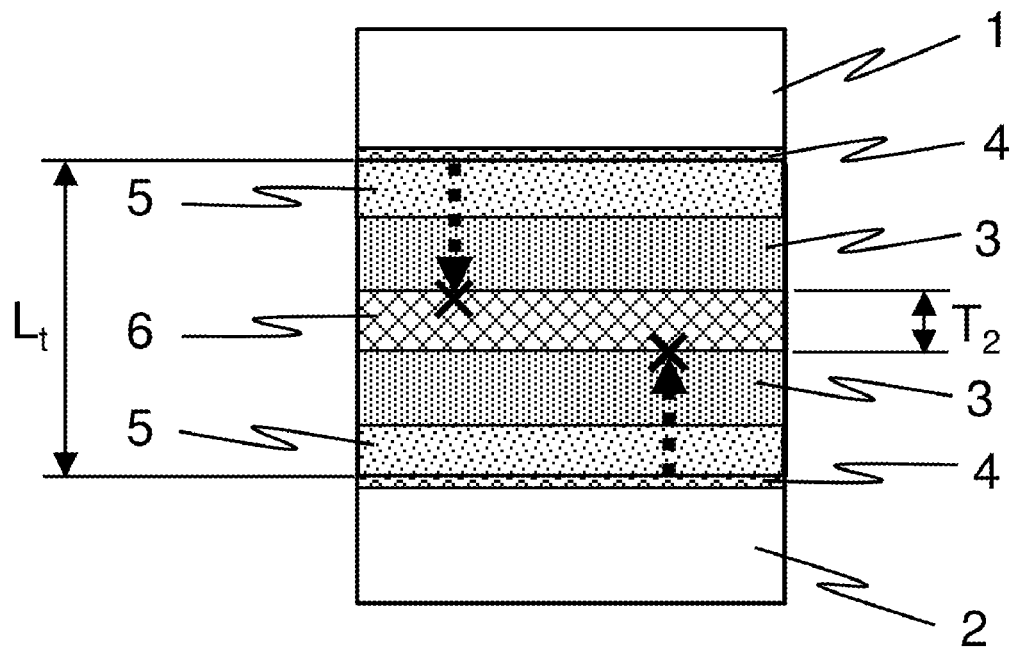
FIG. 8 is a cross-sectional view of a thin layer capacitor according to Embodiment 7 of the present application.
Figure 10:
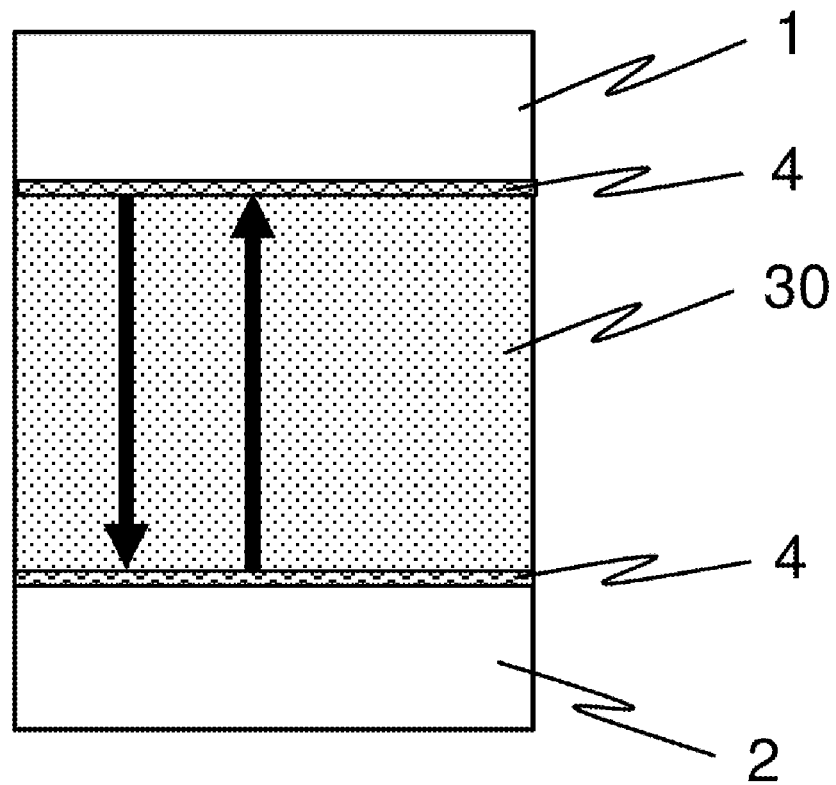
FIG. 10 is a diagram for explaining a problem to be solved.

A cross-sectional view of a thin layer capacitor according to Embodiment 7 of the present application is shown in FIG. 8. The thin layer capacitor of the present embodiment is configured as same as that of Embodiment 1 and includes a high-dielectric-constant amorphous insulating film having a film thickness $T_2$ (see FIG. 8) of 4.5 nm or more, and the total film thickness $L_t$ (see FIG. 8) of the dielectric layer is less than 100 nm.

Measurement of MTTF values of thin layer capacitors corresponding to that of Embodiments 1 and 4 to 7 are tabulated in FIG. 9. Forming the high-dielectric-constant amorphous insulating film 6 having a film thickness of 4.5 nm or more in a thin layer capacitor having a layer thickness less than 100 nm can achieves a practical MTTF of over 1E+6 (one million) hrs. The reliability (MTTF) becomes even higher as the high-dielectric-constant amorphous insulating film 6 is formed further thicker.

This is obvious from FIG. 9, which shows that among thin layer capacitors having a dielectric layers of 50-nm total film thickness, a thin layer capacitor of the present application having the high-dielectric-constant amorphous insulating film 6 of 9 nm thickness achieves a very long MTTF of 5E+11 ($5 \times 10^{11}$) hrs.

In all Embodiments described above, a conductive material containing such as titanium (Ti), gold (Au), platinum (Pt), aluminum (Al), copper (Cu), molybdenum (Mo), tantalum (Ta), niobium (Nb), nickel (Ni), tungsten (W), ruthenium (Ru), or cobalt (Co), or a stack formed of any of these materials can be applied to the upper electrode 1 and the lower electrode 2.

A material such as silicon (Si), gallium arsenide (GaAs), indium phosphorus (InP), gallium nitride (GaN), silicon carbide (SiC), aluminum gallium arsenide (AlGaAs), aluminum gallium nitride (AlGaN), aluminum nitride (AlN), or silicon germanium (SiGe) is applied to the semiconductor described in Embodiment 3.

In addition, the ALD is preferable as a deposition method for the dielectric layer, but a chemical vapor deposition (CVD), vapor deposition, or sputtering other than the ALD is also available. Further, the dry etching for the dielectric layer includes such as a reactive ion etching (RIE), an inductively coupled plasma RIE (ICP-RIE).

It should be noted that each embodiment may be freely combined or appropriately modified or omitted within the scope of the present application.

REFERENCE NUMERALS

1: upper electrode;
2: lower electrode;
3, 3a, 3c: high-breakdown-voltage amorphous film;
4: interfaces between electrode surface and dielectric layer;
5, 5a, 5b: high-dielectric-constant amorphous insulating film;
6, 6a, 6b: high-dielectric-constant amorphous insulating film;
7: semiconductor;
8: combined dielectric layer;
$L_t$: total film thickness of dielectric layer; and
$T_2$: thickness of high-dielectric-constant amorphous insulating film.

The invention claimed is:

1. A thin layer capacitor in a semiconductor device, comprising:
    a dielectric layer of less than 100-nm thickness formed of a plurality of stacked dielectric films having different electric properties and breakdown voltage less than 3 MV/cm and arranged between an upper electrode and a lower electrode, the dielectric layer having:
    high-dielectric-constant amorphous buffer films formed of a dielectric material having a dielectric constant higher than the dielectric constant of silicon nitride and arranged in outermost parts of the dielectric layer and in contact with either one of or both of the upper electrode and the lower electrode, respectively; and
    an intermediate dielectric layer arranged in an intermediate part between the high-dielectric-constant amorphous buffer films, the intermediate dielectric layer including:
        high-breakdown-voltage amorphous films formed of a dielectric material selected among silicon nitride ($Si_xN_y$), silicon oxide ($Si_xO_y$), and silicon oxynitride ($Si_xO_yN_z$) having a breakdown voltage of 8 MV/cm or higher and arranged between and in contact with the high-dielectric-constant amorphous buffer films; and
        a high-dielectric-constant amorphous insulating film formed of a dielectric material having a dielectric constant higher than a dielectric constant of silicon nitride and breakdown voltage less than 3 MV/cm and arranged between and in contact with the high-breakdown-voltage amorphous films.

2. The thin layer capacitor of claim 1, wherein the dielectric layer has only one of the high-dielectric-constant amorphous buffer films, formed in contact with either of the upper electrode or the lower electrode.

3. The thin layer capacitor of claim 1, wherein the intermediate dielectric layer further includes a combined dielectric layer constituted with the high-dielectric-constant amorphous insulating film and the high-breakdown-voltage amorphous film formed of a material selected among silicon nitride ($Si_xN_y$), silicon oxide ($Si_xO_y$), and silicon oxynitride ($Si_xO_yN_z$) each having a breakdown voltage of 8 MV/cm or higher.

4. The thin layer capacitor of claim 1, wherein the high-dielectric-constant amorphous insulating film and the high-dielectric-constant amorphous buffer films are formed of a material selected among tantalum oxide ($Ta_xO_y$), hafnium oxide ($Hf_xO_y$), zirconium oxide ($Zr_xO_y$), titanium oxide ($Ti_xO_y$), lanthanum oxide ($La_xO_y$), niobium oxide ($Nb_xO_y$), aluminum oxide ($Al_xO_y$), yttrium oxide ($Y_xO_y$), strontium titanate ($Sr_xTi_yO_z$), and barium strontium titanate ($Ba_wSr_xTi_yO_z$).

5. The thin layer capacitor of claim 1, wherein the high-dielectric-constant amorphous insulating film has a thickness of 4.5 nm or more.

6. The thin layer capacitor of claim 1, wherein the lower electrode is replaced with a semiconductor.

7. A method of fabricating a thin layer capacitor, comprising:

depositing continuously a dielectric layer including the high-dielectric-constant amorphous insulating film, the high-dielectric-constant amorphous buffer films, and the high-breakdown-voltage amorphous films set forth in claim 1 using an atomic layer deposition (ALD) without exposure to the atmosphere.

* * * * *